United States Patent
Yee et al.

(10) Patent No.: US 6,720,813 B1
(45) Date of Patent: Apr. 13, 2004

(54) DUAL EDGE-TRIGGERED FLIP-FLOP DESIGN WITH ASYNCHRONOUS PROGRAMMABLE RESET

(75) Inventors: Gin S. Yee, Sunnyvale, CA (US); Pradeep R. Trivedi, Sunnyvale, CA (US); Joseph R. Siegel, Shrewsbury, MA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/390,286

(22) Filed: Mar. 17, 2003

(51) Int. Cl.[7] .......................... H03K 3/037; H03K 3/12; H03K 3/286; H03K 3/356
(52) U.S. Cl. ....................... 327/218; 327/203; 327/210
(58) Field of Search ................................ 327/200, 201, 327/202, 203, 208, 209, 210, 211, 212, 217, 218

(56) References Cited

U.S. PATENT DOCUMENTS

| | | | | |
|---|---|---|---|---|
| 5,081,373 A | * | 1/1992 | Suzuki | 327/94 |
| 5,179,295 A | * | 1/1993 | Mattison et al. | 327/199 |
| 6,239,640 B1 | * | 5/2001 | Liao et al. | 327/218 |
| 6,566,927 B2 | * | 5/2003 | Park et al. | 327/211 |

* cited by examiner

*Primary Examiner*—Tuan T. Lam
(74) *Attorney, Agent, or Firm*—Rosenthal & Osha L.L.P.

(57) ABSTRACT

A dual edge-triggered flip-flop that may be programmably reset independent of a clock signal is provided. Using an externally generated reset value, the dual edge-triggered flip-flop may be asynchronously programmed to reset to either a logical high or a logical low. Further, a dual edge-triggered flip-flop that may be set to multiple triggering modes is provided. Using an externally generated enable signal, the dual edge-triggered flip-flop may be set to function as a single edge-triggered or a dual edge-triggered device. Thus, the dual edge-triggered flip-flop may be used multiple types of computing environments.

19 Claims, 6 Drawing Sheets

DUAL EDGE-TRIGGERED FLIP-FLOP DESIGN WITH ASYNCHRONOUS PROGRAMMABLE RESET

BACKGROUND OF THE INVENTION

A typical computer system includes at least a microprocessor and some form of memory. The microprocessor has, among other components, arithmetic, logic, and control circuitry that interpret and execute instructions necessary for the operation and use of the computer system. FIG. 1 shows a typical computer system (10) having a microprocessor (12), memory (14), integrated circuits (16) that have various functionalities, and communication paths (18), i.e., buses and wires, that are necessary for the transfer of data among the aforementioned components of the computer system (10).

The various computations and operations performed by the computer system are facilitated through the use of signals that provide electrical pathways for data to propagate between the various components of the computer system. In a general sense, the passing of data onto a signal may be accomplished by changing, i.e., transitioning, the logical value, i.e., the logical state, of the signal. Specifically, the logical state of a signal may be transitioned by either raising the voltage of the signal or reducing the voltage of the signal. When the voltage is raised, the signal is said to be at a "logic high," and when the voltage is reduced, the signal is said to be at a "logic low."

An integrated circuit, such as one shown in FIG. 1, includes various types of elementary logic components that are used to store, transfer, and/or manipulate the logical values of signals. One example of an elementary logic component is a flip-flop. In general, a flip-flop is a state element, i.e., a device that stores the logical state of a signal, capable of outputting a stored signal state depending on a logical transition of a clock signal at an input of the flip-flop.

In many cases, flip-flops in integrated circuits are single edge-triggered. Single edge-triggered flip-flops store, i.e., latch, state either on a positive edge (a low to high transition) of a clock signal or on a negative edge (a high to low transition) of the clock signal. A faster data rate and some power savings can be achieved if a flip-flop is designed such that the flip-flop latches state on both the positive edge and negative edge of a clock signal. Such flip-flops are referred to as dual edge-triggered flip-flops.

FIG. 2a shows a typical dual edge-triggered flip-flop (19). As shown in FIG. 2a, the dual edge-triggered flip-flop (19) has a data input d, a data output q, and a clock signal input ck. The dual edge-triggered flip-flop (19) is designed such that a value at the data input d is transferred to the data output q on both positive and a negative edges of a clock signal clk inputted at the clock signal input ck.

FIG. 2b shows a circuit diagram of the dual edge-triggered flip-flop (19) shown in FIG. 2a. As shown, the dual edge-triggered flip-flop (19) includes a first latch (20) and a second latch (21), each formed by a pair of cross-coupled inverters. A first pass gate (22) (typically formed by a P-channel transistor coupled to an N-channel transistor) and a second pass gate (24) are coupled at terminals of the first latch (20). The first pass gate (22) and the second pass gate (24) respectively receive complemented and non-complemented versions of the clk signal. Likewise, a third pass gate (25) and a fourth pass gate (23) are coupled at terminals of the second latch (21) and respectively receive complemented and non-complemented versions of the clk signal. Accordingly, on a positive edge of the clock clk signal, the data stored by the first latch (20) is sent to data output q, and, on the negative edge of the clk signal, the data stored by the second latch (21) is sent to data output q.

SUMMARY OF INVENTION

According to one aspect of the invention, a dual edge-triggered flip-flop capable of being programmably reset independent of an input clock signal comprises control circuitry arranged to receive the input clock signal and a reset signal; negative edge-triggered circuitry operatively connected to the control circuitry and arranged to receive a data signal and a reset value signal, wherein the negative edge-triggered circuitry generates a first output value dependent on the control circuitry and the data signal; positive edge-triggered circuitry operatively connected to the control circuitry and arranged to receive the data signal and the reset value signal, wherein the positive edge-triggered circuitry generates a second output value dependent on the control circuitry and the data signal; and output circuitry operatively connected to the negative edge-triggered circuitry and the positive edge-triggered circuitry, wherein the output circuitry generates an output signal dependent on one selected from a group consisting of the first output value and the second output value, wherein, upon assertion of the reset signal, the output signal is set to a value of the reset value signal asynchronous of the input clock signal.

According to another aspect of the invention, a dual edge-triggered flip-flop capable of being programmably reset asynchronous of an input clock signal comprises control means for receiving the input clock signal and a reset signal; negative edge-triggered means for generating a first output value dependent on the control means and a data signal; positive edge-triggered means for generating a second output value dependent on the control means and the data signal; and output means for generating an output signal dependent on one selected from a group consisting of the first output value and the second output value, wherein, upon assertion of the reset signal, the output signal is set to a programmed value asynchronous of the input clock signal.

According to another aspect of the invention, a method for performing a dual edge-triggered flip-flop operation comprises inputting a data signal, a reset signal, and a reset value signal; latching a first value on a positive edge of an input clock signal dependent on the data signal; latching a second value on a negative edge of the input clock signal dependent on the data signal; generating an output signal dependent on the input clock signal, an enable signal, and one selected from a group consisting of the first value and the second value; and upon assertion of the reset signal, setting the output signal to a value of the reset value signal asynchronous of the input clock signal.

Other aspects and advantages of the invention will be apparent from the following description and the appended claims.

BRIEF DESCRIPTION OF THE DRAWINGS

FIG. 2b shows a circuit schematic of the dual edge-triggered flip-flop shown in FIG. 2a.

DETAILED DESCRIPTION

Figure 1:
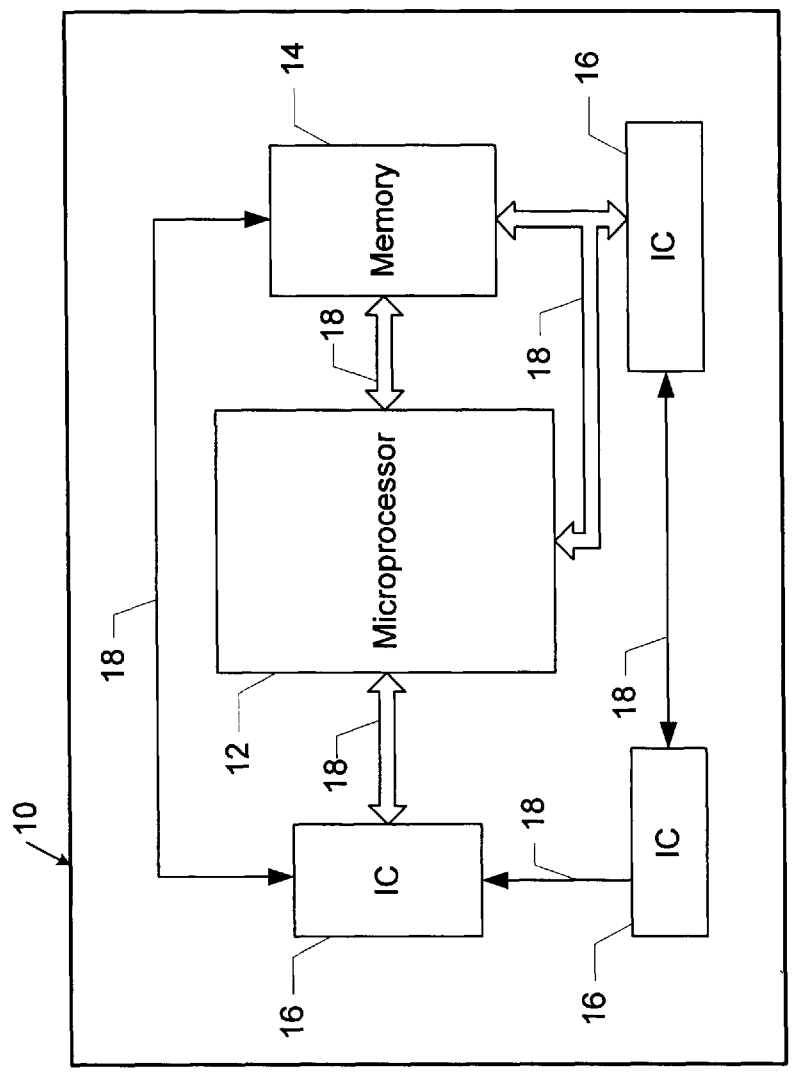
FIG. 1 shows a typical computer system.
Figure 2A:
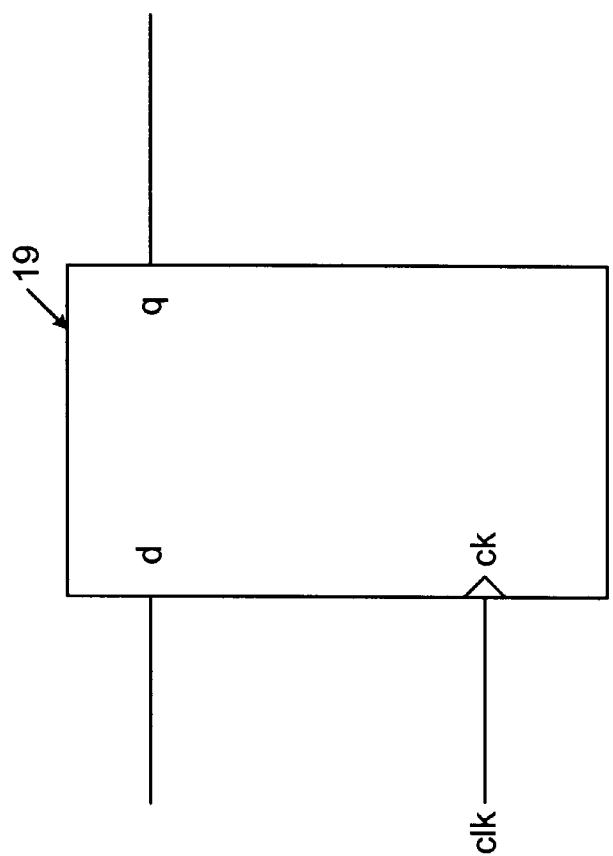
FIG. 2a shows a block diagram of a typical dual edge-triggered flip-flop.
Figure 2B:
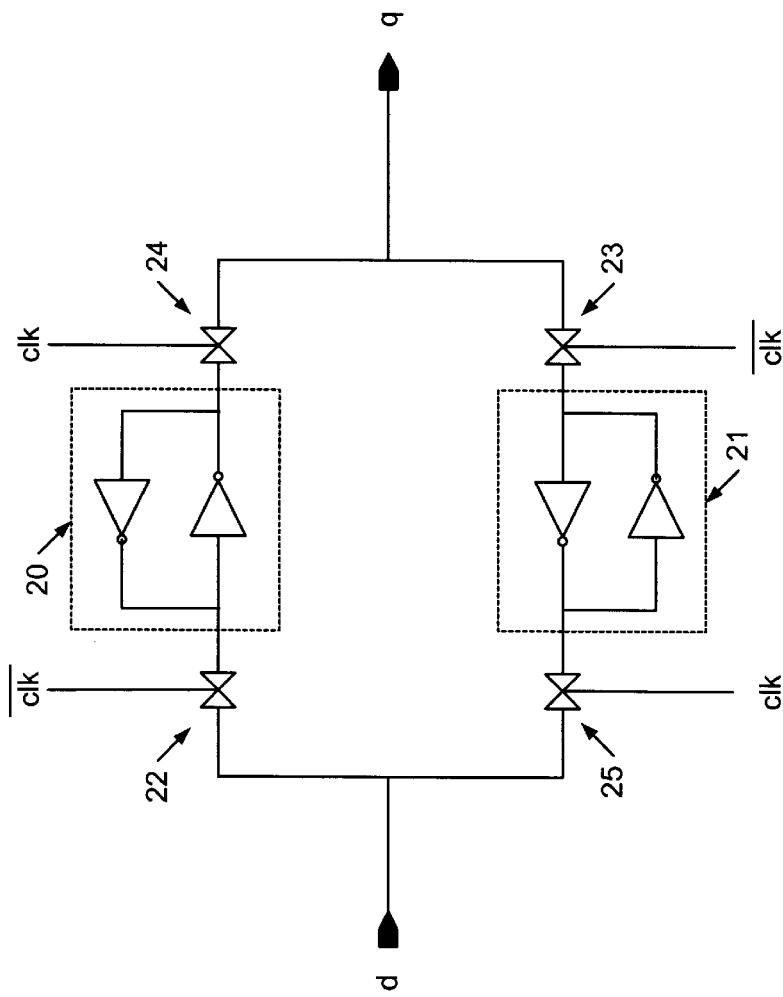
Figure 3:
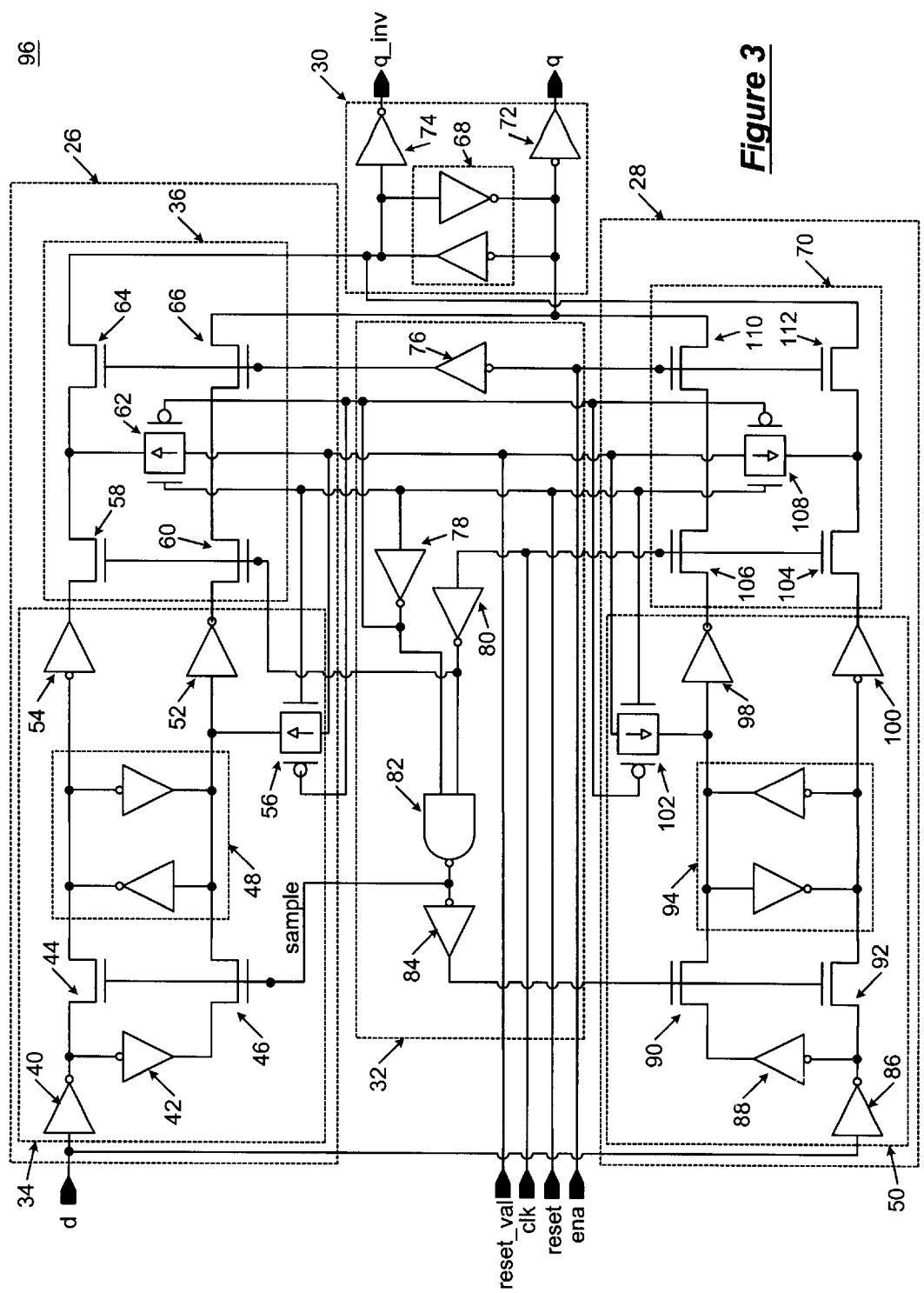
FIG. 3 shows a circuit schematic of a dual edge-triggered flip-flop in accordance with an embodiment of the present invention.

Embodiments of the present invention will be described with reference to the accompanying drawings. Embodiments of the present invention relate to a dual edge-triggered flip-flop that may be programmably reset independent of a clock signal. FIG. 3 shows an exemplary circuit-level schematic of a dual edge-triggered flip-flop (96) in accordance with an embodiment of the present invention. The dual edge-triggered flip-flop (96) includes a negative edge-triggered flip-flop portion and a positive edge-triggered flip-flop portion, both of which may be programmed to reset independent of an input clock signal.

In the embodiment shown in FIG. 3, the negative edge-triggered flip-flop portion is formed by negative edge-triggered circuitry (26) and output circuitry (30), and the positive edge-triggered flip-flop portion is formed by positive edge-triggered circuitry (28) and the output circuitry (30). Further, the dual edge-triggered flip-flop (96) shown includes control circuitry (32) that may be used to reset and/or enable the negative edge-triggered and the positive edge-triggered flip-flop portions.

In addition to the above-mentioned circuitry, the dual edge-triggered flip-flop (96) includes the following inputs and outputs: a data input d, a clock input clk, an enable input ena, reset inputs reset_val and reset, a data output q, and q's complement q_inv. A value of the data input d serves as an input to the negative edge-triggered and the positive edge-triggered circuitries (26, 28); the inputs clk, ena, reset_val, and reset serve as inputs to the negative edge-triggered, the positive edge-triggered, and the control circuitries (26, 28, 32); and the outputs q and q_inv are outputs of the output circuitry (30).

Note that, unless otherwise stated, the following description of FIG. 3 assumes that the value of the reset signal is low, i.e., the dual edge-triggered flip-flop (96) is not being reset. The negative edge-triggered circuitry (26) includes a master portion (34) and a slave portion (36). The master portion (34) includes the following circuitry: a first inverter (40), a second inverter (42), a first transistor (44), a second transistor (46), a first latch (48) formed by a pair of cross-coupled inverters, a first pass gate (56), a third inverter (54), and a fourth inverter (52). The first inverter (40) inputs the d signal and outputs d's complement, referred to herein as d_inv, to the second inverter (42) and to a drain gate of the first transistor (44). The second inverter (46) inverts d_inv and, thus, outputs d to a drain terminal of the second transistor (46). Both the first transistor (44) and the second transistor (46) input a sample signal (whose derivation is described below) to their respective gate terminals.

When the sample signal is high, the first and second transistors (44, 46) turn 'on' and respectively output d and d_inv to the latch (48). Specifically, the first transistor (44) outputs d_inv to a first terminal of the latch (48), and the second transistor (46) outputs d to a second terminal of the latch (48). Further, the first terminal of the latch (48) inputs d_inv to the third inverter (54), and the second terminal of the latch (48) inputs d to the fourth inverter (52). In addition, an output terminal of the first pass gate (56) is connected to the input of the fourth inverter (52). The first pass gate (56) inputs the reset_val signal and is controlled by complemented and non-complemented versions of the reset signal. When reset is high, the first pass gate (56) turns 'on' and outputs reset_val to the fourth inverter (52). Thus, reset_val may be used to reset the input of the fourth inverter (52) to a logical high or low.

Note that, because reset_val determines the reset value of the dual edge-triggered flip-flop (96), the outputs q and q_inv may be reset to a high value or to a low value. Further, because the reset_val signal is externally generated and inputted to the dual edge-triggered flip-flop (96), the reset value of reset_val may be decided upon after the dual edge-triggered flip-flop (96) has been fabricated, i.e., manufactured. Thus, the dual edge-triggered flip-flop (96) may be programmed to reset to multiple reset modes. Thus, the dual edge-triggered flip-flop (96) may be used in multiple types of computing environments.

In addition, those skilled in the art will appreciate that, dependent on particular design goals and/or requirements, the circuitry and/or signals used to implement the reset function of the dual edge-triggered flip-flip (96) may be configured differently from the manner shown in FIG. 3 without departing from the scope of the present invention.

Referring to FIG. 3, the slave portion (36) of the negative edge-triggered circuitry (26) includes the following circuitry: a third transistor (58), a fourth transistor (60), a second pass gate (62), a fifth transistor (64) and a sixth transistor (66). The third transistor (58) inputs d from the third inverter (54), and the fourth transistor (60) inputs d_inv from the fourth inverter (52). Both the third transistor (58) and the fourth transistor (60) input a complement of the clk signal to their respective gate terminals. Thus, when clk is low, the third and fourth transistors (58, 60) turn 'on' and respectively output d and d_inv to the fifth and sixth transistors (64, 66). Further, the fifth and sixth transistors (64, 66) input a complement of the ena signal to their respective gate terminals. Thus, when ena is low, the fifth and sixth transistors (64, 66) turn 'on' and respectively output d and d_inv.

In addition, the output terminal of the second pass gate (62) is connected to the input of the fifth transistor (64). The second pass gate (62) inputs the reset_val signal and is controlled by complemented and non-complemented versions of the reset signal. When reset is high, the second pass gate (62) turns 'on,' and reset_val is inputted to the fifth transistor (64). Thus, reset_val may be used to reset the input of the fifth transistor (64) to a logical high or low.

As shown in FIG. 3, the positive edge-triggered circuitry (28) includes a master portion (50) and a slave portion (70). The master portion (70) includes the following circuitry: a first inverter (86), a second inverter (88), a first transistor (92), a second transistor (90), a first latch (94) formed by a pair of cross-coupled inverters, a first pass gate (102), a third inverter (100), and a fourth inverter (98). The slave portion (70) includes the following circuitry: a third transistor (104), a fourth transistor (106), a second pass gate (108), a fifth transistor (112), and a sixth transistor (110).

Note that the circuitry included in the positive edge-triggered circuitry (28) is configured in the manner described above for the negative edge-triggered circuitry (26) with the following input signal exceptions. First, the first and second transistors (92, 90) do not input the sample signal to their respective gate terminals. Instead, the gate terminals of the first and second transistors (92, 90) input a complement of the sample signal. Thus, when sample is low, the first and second transistors (92, 90) turn 'on' and respectively output d and d_inv to the latch (94). Second, the third and fourth transistors (104, 106) do not input the complement of the clk signal to their respective gate terminals. Instead, the gate terminals of the third and fourth transistors (104, 106) input the clk signal. Thus, when clk is high, the third and fourth transistors (104, 106) turn 'on' and respectively output d and d_inv to the fifth and sixth transistors (112, 110). Third, the fifth and sixth transistors do not input the complement of the ena signal. Instead, the gate terminals of the fifth and sixth transistors (112, 110) input the ena signal. Thus, when ena is high, the fifth and sixth transistors (112, 110) turn 'on' and respectively output d and d_inv.

Referring to FIG. 3, the output circuitry (30) includes the following circuitry: a first inverter (72), a second inverter (74), and a latch (68) formed by a pair of cross-coupled inverters. A first terminal of the latch (68) is connected to sixth transistors (66, 110) of the negative edge-triggered and positive edge-triggered circuitries (26, 28), respectively; and a second terminal of the latch is connected to fifth transistors (64, 112) of the negative edge-triggered and positive edge-triggered circuitries (26, 28), respectively. Thus, depending on the value of the ena signal, the latch (68) inputs d_inv and d from either the negative edge-triggered circuitry (26) or the positive edge-triggered circuitry (28).

Specifically, when ena is low, the latch's (68) first terminal inputs d_inv from the negative edge-triggered circuitry's sixth transistor (66) and the latch's (68) second terminal inputs d from the negative edge-triggered circuitry's fifth transistor (64). When ena is high, the latch's (68) first terminal inputs d_inv from the positive edge-triggered circuitry's sixth transistor (110) and the latch's (68) second terminal inputs d from the positive edge-triggered circuitry's fifth transistor (112). Further, the first terminal of the latch (68) inputs d_inv to the first inverter (72), and the second terminal of the latch (68) inputs d to the second inverter (74). The first and second inverters (72, 74) output d and d_inv respectively as the output signals q and q_inv for the dual edge-triggered flip-flop (96). As shown, the first inverter (72) outputs q, and the second inverter (74) outputs q_inv.

Referring to FIG. 3, the control circuitry (32) includes the following circuitry: a first inverter (76), a second inverter (78), a third inverter (80), a NAND gate, and a fourth inverter (84). The first inverter (76) is used to generate the complement of the ena signal. Thus, the first inverter (76) inputs the ena signal and outputs the ena complement to the negative edge-triggered circuitry's (26) fifth and sixth transistors (64, 66).

Note that, when ena is low, the dual edge-triggered flip-flop (96) is negative edge-triggered, whereas, when ena is high, the dual edge-triggered flip-flop (96) is positive edge-triggered. Thus, dependent on the value of ena, the present invention may be set to function as a single edge-triggered device or as a dual edge-triggered device. For example, if the ena signal is always low or high, the embodiment shown in FIG. 3 respectively only functions as a negative or positive edge-triggered device. However, if the ena signal oscillates between high and low, the embodiment shown in FIG. 3 may alternate between functioning as a negative edge-triggered and a positive edge-triggered device.

Referring again to FIG. 3, the second inverter (78) is used to generate the complement of the reset signal. Thus, the second inverter (78) inputs the reset signal and outputs the reset complement to the second pass gates (62, 108) of the negative edge-triggered and the positive edge-triggered circuitries (26, 28 respectively). The third inverter (80) is used to generate the complement of the clk signal. Thus, the third inverter (80) inputs the clk signal and outputs the clk complement to the negative edge-triggered circuitry's (26) third and fourth transistors (58, 60).

Further, the second and third inverters (78, 80) respectively input the reset complement and the clk complement to the NAND gate (82). The NAND gate is used to generate the sample signal. The sample signal is inputted to the fourth inverter (84) and to the negative edge-triggered circuitry's (26) first and second transistors (44, 46). The fourth inverter (84) outputs the complement of the sample signal to the positive edge-triggered circuitry's (28) first and second transistors (90, 92). Thus, whenever reset and clk are both low, sample is low, i.e., the negative edge-triggered circuitry's (26) first and second transistors (44, 46) are 'on,' and the positive edge-triggered circuitry's (28) first and second transistors (92, 90) are 'off.' Otherwise, sample is high, i.e., the negative edge-triggered circuitry's (26) first and second transistors (44, 46) are 'off,' and the positive edge-triggered circuitry's (28) first and second transistors (92, 90) are 'on.'

Note that, because the control circuitry (32) generates clk's complement before the sample signal, clk's complement is inputted to the slave portions (36, 70) of the negative and positive edge-triggered circuitries (26, 28, respectively) before sample is inputted to corresponding master portions (34, 50, respectively). As a result, a hold time, i.e., a time delay, for q to become stable may be decreased.

Figure 4A:
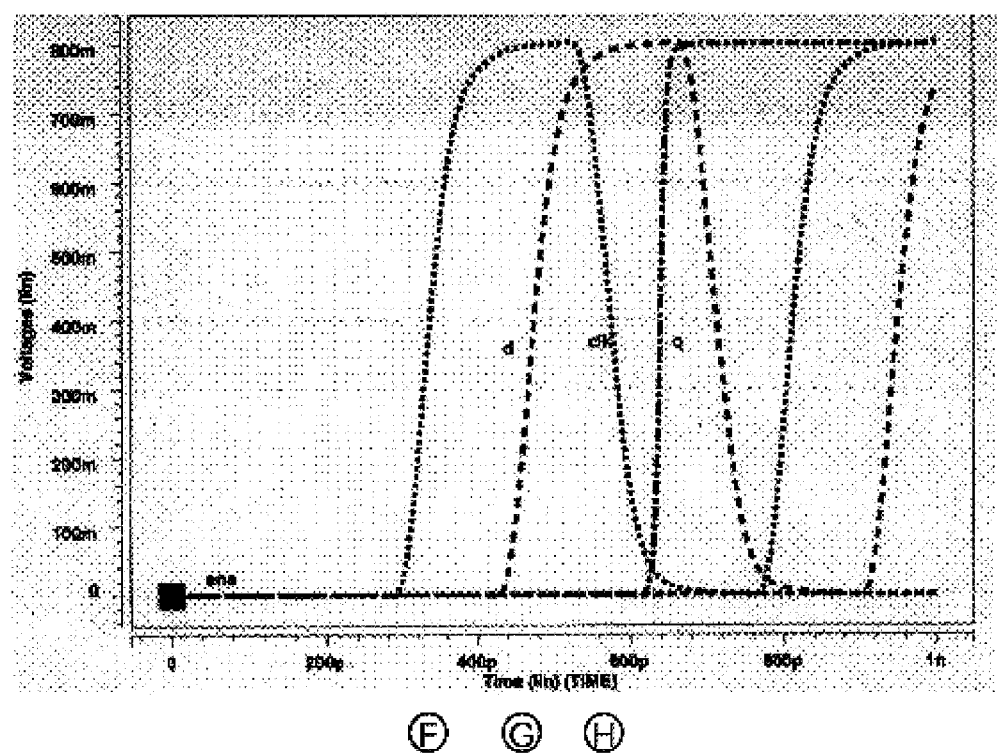
FIGS. 4a–4b show simulation waveforms in accordance with the embodiment shown in FIG. 3.
Figure 4B:
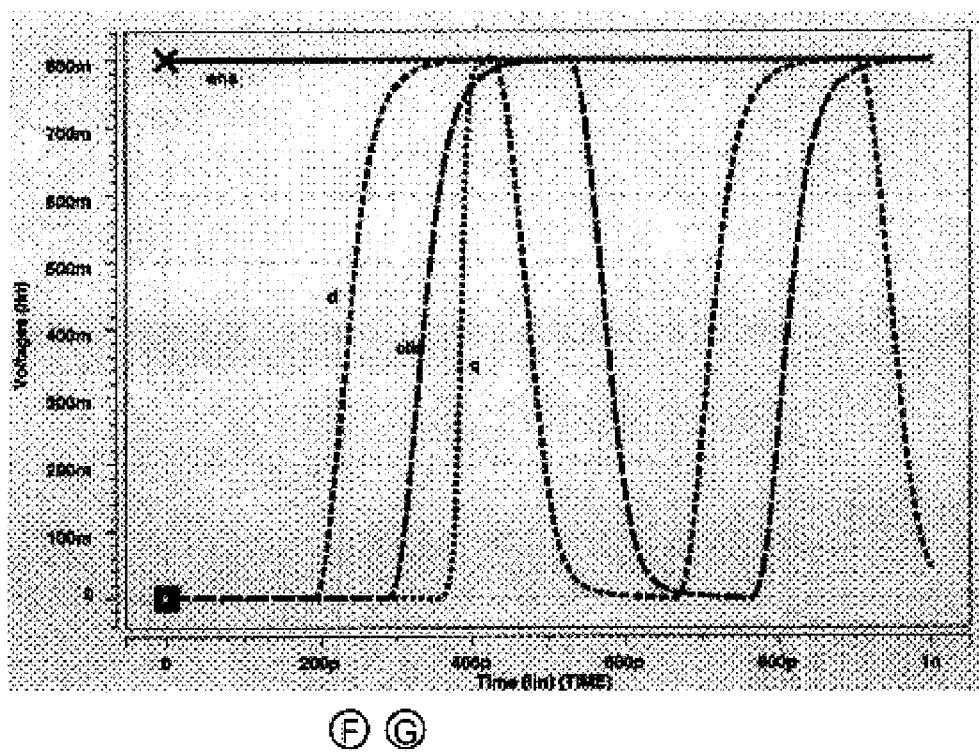

FIGS. 4a–4b show simulation waveforms in accordance with the embodiment shown in FIG. 3. In FIGS. 4a–4b, the logical values of the signals ena, clk, d, and q are shown as seen by the dual edge-triggered flip-flop (96) during a particular time interval. Note that, although not shown in FIGS. 4a–4b, the value of the reset signal is set to low. Further, note that, in FIG. 4a, ena is set to low, i.e., the dual edge-triggered flip-flop (96) is set to be negative edge-triggered. Thus, the description given for FIG. 4a shows the propagation of the d signal through the negative edge-triggered flip-flop portion of the dual edge-triggered flip-flop (96). Conversely, in FIG. 4b, ena is set to high, i.e., the dual edge-triggered flip-flop (96) is set to be positive edge-triggered. Thus, the description given for FIG. 4b shows the propagation of the d signal through the positive edge-triggered flip-flop portion of the dual edge-triggered flip-flop (96).

In FIG. 4a, points "F" through "H" represent different points in time during the time intervals in which the waveforms are recorded. Referring to FIG. 4a, just before point "F," the signal values of d, q, and clk are low. Thus, the negative edge-triggered circuitry's (26) third and fourth transistors are 'on' (58, 60), i.e., new values can be loaded into latch (68), and the first and second transistors (44, 46) are 'off,' i.e., no new values can be loaded into latch (48). As a result, latch (68) loads the most recently stored value of d from latch (48), and outputs this value as q, a low. However, because no new values can be loaded into latch (48), latch (48) continues to hold the most recently stored value of d.

At point "F," clk transitions from low to high, i.e., a positive edge transition. As a result, clk's complement transitions to low, i.e., the third and fourth transistors (58, 60) turn 'off,' and sample transitions to high, i.e., the first and second transistors (40, 42) turn 'on.' Thus, no new values can be loaded into latch (68), whereas new values can be loaded into latch (48). As a result, latch (48) inputs current value of d, a low. However, because no new values can be loaded into latch (68), latch (68) continues to hold the most recently stored value for q. At point "G," d transitions from low to high, i.e., a positive edge transition. As a result, the signal value inputted by latch (48) switches to a high. However, because new values still cannot be loaded into latch (68), latch (68) continues to hold the most recently stored value for q, a low.

At point "H," clk transitions from high to low, i.e., a negative edge transition. As a result, clk's complement transitions to high, i.e., the third and fourth transistors (58, 60) turn 'on,' and sample transitions to low, i.e., the first and second transistors (40, 42) turn 'off.' Thus, new values can now be loaded into latch (68), whereas no new values can be loaded into latch (48). As a result, latch (68) loads the most recently stored value of d from latch (48), a high, and outputs this value as q, a high. Thus, at the negative edge transition of clk, the value of q transitions from low to high.

In FIG. 4b, points "F" and "G" represent different points in time during the time intervals in which the waveforms are recorded. Referring to FIG. 4b, just before point "F," the signal values of d, q, and clk are low. Thus, the positive edge-triggered circuitry's (28) third and fourth transistors (104, 106) are 'off,' i.e., no new values can be loaded into latch (68), and the first and second transistors (92, 90) are 'on,' i.e., new values can be loaded into latch (94). As a result, latch (94) inputs current value of d, a low. However, because no new values can be loaded into latch (68), latch (68) continues to hold the most recently stored value for q. At point "F," d transitions from low to high, i.e., a positive edge transition. As a result, the signal value inputted by latch (94) switches to a high. However, because new values still cannot be loaded into latch (68), latch (68) continues to hold the most recently stored value for q, a low.

At point "G," clk transitions from low to high, i.e., a positive edge transition. As a result, sample's complement transitions to low. Thus, the third and fourth transistors (104, 106) turn 'on,' i.e., new values can now be loaded into latch (68), and the first and second transistors (92, 90) turn 'off,' i.e., no new values can be loaded into latch (94). As a result, latch (68) loads the most recently stored value of d from latch (94), a high, and outputs this value as q, a high. Thus, at the positive edge transition of clk, the value of q transitions from low to high.

Advantages of the present invention may include one or more of the following. In one or more embodiments, because an externally generated reset value is used to reset a dual edge-triggered flip-flop, a reset state for the dual edge-triggered flip-flop may be determined after the dual edge-triggered flip-flop has been fabricated. Thus, the dual edge-triggered flip-flop may be programmed to reset to multiple reset modes. Thus, the dual edge-triggered flip-flop may be used in multiple types of computing environments.

In one or more embodiments, because an externally generated enable signal is used to determine the triggering state of a dual edge-triggered flip-flop, the dual edge-triggered flip-flop may be set to function as a single edge-triggered or a dual edge-triggered device. Thus, the dual edge-triggered flip-flop may be used in multiple types of computing environments.

In one or more embodiments, because a slave portion of a dual edge-triggered flip-flop inputs a clock signal before a master portion of the dual edge-triggered flip-flop inputs the clock signal, a hold time for the output of the dual edge-triggered flip-flop may be minimized.

In one or more embodiments, the dual edge-triggered flip-flop may be asynchronously programmed to reset to either a logical high or a logical low. Thus, the dual edge-triggered flip-flop may be used in multiple types of computing environments.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A dual edge-triggered flip-flop programmably resetable independent of an input clock signal, comprising:

control circuitry arranged to receive the input clock signal and a reset signal;

negative edge-triggered circuitry operatively connected to the control circuitry and arranged to receive a data signal and a reset value signal, wherein the negative edge-triggered circuitry generates a first output value dependent on the control circuitry and the data signal;

positive edge-triggered circuitry operatively connected to the control circuitry and arranged to receive the data signal and the reset value signal, wherein the positive edge-triggered circuitry generates a second output value dependent on the control circuitry and the data signal; and output circuitry operatively connected to the negative edge-triggered circuitry and the positive edge-triggered circuitry, wherein the output circuitry generates an output signal dependent on one selected from a group consisting of the first output value and the second output value, wherein, upon assertion of the reset signal, the output signal is set to a value of the reset value signal asynchronous of the input clock signal.

2. The dual edge-triggered flip-flop of claim 1, wherein the control circuitry is arranged to receive an enable signal, and wherein the output signal is set to one selected from a group consisting of the first output value and the second output value dependent on the enable signal.

3. The dual edge-triggered flip-flop of claim 1, wherein the control circuitry comprises:

a first inverter arranged to receive the input clock signal;

a second inverter arranged to receive the reset signal;

a logic gate operatively connected to the first inverter and the second inverter, wherein the logic gate generates a sample signal dependent on the input clock signal and the reset signal; and a third inverter operatively connected to the logic gate, wherein the third inverter generates a complement of the sample signal, wherein the sample signal is output to the negative edge-triggered circuitry and the complement of the sample signal is output to the positive edge-triggered circuitry.

4. The dual edge-triggered flip-flop of claim 3, wherein the control circuitry further comprises a fourth inverter arranged to receive an enable signal, and wherein the fourth inverter is operatively connected to the negative edge-triggered circuitry and the positive edge-triggered circuitry.

5. The dual edge-triggered flip-flop of claim 1, wherein the negative edge-triggered circuitry comprises:

a master portion operatively connected to the control circuitry and arranged to receive the data signal, wherein the master portion generates the first output value dependent on the input clock signal, the data signal, and the reset signal; and a slave portion operatively connected to the control circuitry and the master portion, wherein the slave portion transfers the first output value from the master portion to the output circuitry dependent on the input clock signal and an enable signal.

6. The dual edge-triggered flip-flop of claim 5, wherein the master portion comprises:
- a first inverter arranged to receive the data signal, wherein the first inverter generates a first data value;
- a second inverter operatively connected to the first inverter, wherein the second inverter generates a second data value;
- a first transistor arranged to receive the first data value from the first inverter;
- a second transistor arranged to receive the second data value from the second inverter;
- a latch operatively connected to the first transistor and the second transistor, wherein the latch is arranged to receive the first data value and the second data value dependent on the input clock signal; and
- a third inverter arranged to receive the first data value from the latch, wherein the third inverter is operatively connected to the slave portion; and
- a fourth inverter arranged to receive the second data value from the latch, wherein the fourth inverter is operatively connected to the slave portion.

7. The dual edge-triggered flip-flop of claim 6, wherein the master portion further comprises a first pass gate operatively connected to the fourth inverter and arranged to receive the reset signal and the reset value signal, and wherein the first pass gate resets the second data value to the value of the reset value signal dependent on the reset signal.

8. The dual edge-triggered flip-flop of claim 6, wherein the slave portion comprises:
- a third transistor arranged to receive the first data value;
- a fourth transistor arranged to receive the second data value;
- a fifth transistor operatively connected to the third transistor, wherein the fifth transistor is arranged to receive the first data value dependent on the input clock signal; and
- a sixth transistor operatively connected to the fourth transistor, wherein the sixth transistor is arranged to receive the second data value dependent on the input clock signal,
- wherein the fifth transistor transfers the first value to and the sixth transistor transfers the second value to the output circuitry dependent on the enable signal.

9. The dual edge-triggered flip-flop of claim 8, wherein the slave portion further comprises a second pass gate operatively connected to the fifth transistor and arranged to receive the reset signal and the reset value signal, and wherein the second pass gate resets the first data value to the value of the reset value signal dependent on the reset signal.

10. The dual edge-triggered flip-flop of claim 1, wherein the positive edge-triggered circuitry comprises:
- a master portion operatively connected to the control circuitry and arranged to receive the data signal, wherein the master portion generates the second output value dependent on the input clock signal, the data signal, and the reset signal; and
- a slave portion operatively connected to the control circuitry and the master portion, wherein the slave portion transfers the second output value from the master portion to the output circuitry dependent on the input clock signal and an enable signal.

11. The dual edge-triggered flip-flop of claim 10, wherein the master portion comprises:
- a first inverter arranged to receive the data signal, wherein the first inverter generates a first data value;
- a second inverter operatively connected to the first inverter, wherein the second inverter generates a second data value;
- a first transistor that inputs the first data value from the first inverter;
- a second transistor that inputs the second data value from the second inverter;
- a latch operatively connected to the first transistor and the second transistor, wherein the latch is arranged to receive the first data value and the second data value dependent on the input clock signal; and
- a third inverter arranged to receive the first data value from the latch, wherein the third inverter is operatively connected to the slave portion; and
- a fourth inverter arranged to receive the second data value from the latch, wherein the fourth inverter is operatively connected to the slave portion.

12. The dual edge-triggered flip-flop of claim 11, wherein the master portion further comprises a first pass gate operatively connected to the fourth inverter and arranged to receive the reset signal and the reset value signal, and wherein the first pass gate resets the second data value to the value of the reset value signal dependent on the reset signal.

13. The dual edge-triggered flip-flop of claim 11, wherein the slave portion comprises:
- a third transistor arranged to receive the first data value;
- a fourth transistor arranged to receive the second data value;
- a fifth transistor operatively connected to the third transistor, wherein the fifth transistor is arranged to receive the first data value dependent on the input clock signal; and
- a sixth transistor operatively connected to the fourth transistor, wherein the sixth transistor is arranged to receive the second data value dependent on the input clock signal,
- wherein the fifth transistor transfers the first value to and the sixth transistor transfers the second value to the output circuitry dependent on the enable signal.

14. The dual edge-triggered flip-flop of claim 13, wherein the slave portion further comprises a second pass gate operatively connected to the fifth transistor and arranged to receive the reset signal and the reset value signal, and wherein the second pass gate resets the first data value to the value of the reset value signal dependent on the reset signal.

15. The dual edge-triggered flip-flop of claim 1, wherein the output circuitry comprises:
- a latch that stores a value of one selected from a group consisting of the first output value and the second output value dependent on the input clock signal and an enable signal;
- a first inverter operatively connected to the latch and arranged to receive the stored value, wherein the first inverter generates the output signal using the stored value; and
- a second inverter operatively connected to the latch, wherein the second inverter generates a complement of the output signal dependent on the stored value.

16. A dual edge-triggered flip-flop programmably resetable asynchronous of an input clock signal, comprising:
- control means for receiving the input clock signal and a reset signal;
- negative edge-triggered means for generating a first output value dependent on the control means and a data signal;

positive edge-triggered means for generating a second output value dependent on the control means and the data signal; and output means for generating an output signal dependent on one selected from a group consisting of the first output value and the second output value, wherein, upon assertion of the reset signal, the output signal is set to a programmed value asynchronous of the input clock signal.

17. The dual edge-triggered flip-flop of claim 16, wherein the output signal is set to the programmed value dependent on a reset value signal inputted by the negative edge-triggered means and by the positive edge-triggered means.

18. The dual edge-triggered flip-flop of claim 16, wherein the output signal is generated dependent on an enable signal inputted by the control means.

19. A method for performing a dual edge-triggered flip-flop operation, comprising:

inputting a data signal, a reset signal, and a reset value signal;

latching a first value on a positive edge of an input clock signal dependent on the data signal;

latching a second value on a negative edge of the input clock signal dependent on the data signal;

generating an output signal dependent on the input clock signal, an enable signal, and one selected from a group consisting of the first value and the second value; and upon assertion of the reset signal, setting the output signal to a value of the reset value signal asynchronous of the input clock signal.

* * * * *